(12) United States Patent
Penney

(10) Patent No.: US 10,176,862 B1
(45) Date of Patent: Jan. 8, 2019

(54) DATA STROBE GATING

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/880,994

(22) Filed: Jan. 26, 2018

(51) Int. Cl.
*G11C 7/00* (2006.01)
*G11C 11/4076* (2006.01)
*G06F 11/10* (2006.01)
*G11C 11/4096* (2006.01)

(52) U.S. Cl.
CPC ...... *G11C 11/4076* (2013.01); *G06F 11/1004* (2013.01); *G11C 11/4096* (2013.01)

(58) Field of Classification Search
CPC ....... G11C 7/22; G11C 7/1066; G11C 7/1051; G11C 7/1078; G11C 11/4076

USPC .......................................... 365/193, 189.05
See application file for complete search history.

(56) References Cited

U.S. PATENT DOCUMENTS 7,826,281 B2 * 11/2010 Nakashima ......... G06F 13/1689
365/189.15
8,121,237 B2 * 2/2012 Stott ..................... G11C 7/1051
365/193

\* cited by examiner

*Primary Examiner* — Son Dinh
(74) *Attorney, Agent, or Firm* — Fletcher Yoder, P.C.

(57) ABSTRACT

Methods and devices for gating an internal data strobe from an input buffer of a memory device. The gating function occurs after a write operation ceases but before an external controller stops driving an external data strobe that is used to generate the internal data strobe. The methods and devices use local counters to count how many pulses have occurred on the data strobe during a write operation. When the local counters indicate that an expected number of cycles for the write operation have elapsed, the local counters indicate that the write operation has completed. This indication causes gating circuitry to cut off the internal data strobe from writing circuitry.

18 Claims, 8 Drawing Sheets

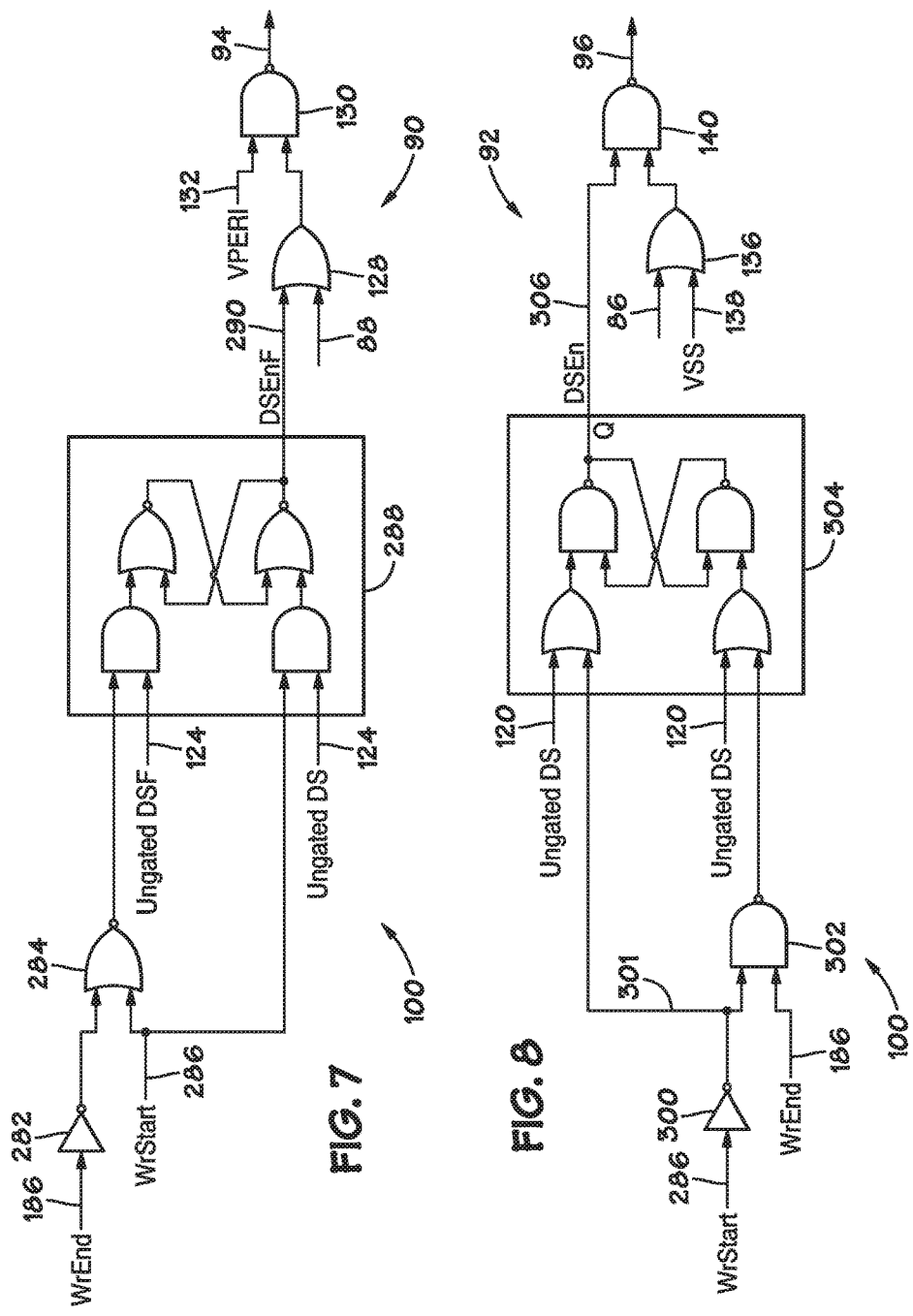

DATA STROBE GATING

BACKGROUND

Field of the Present Disclosure

Embodiments of the present disclosure relate generally to the field of semiconductor devices. More specifically, embodiments of the present disclosure relate to reducing postambles for write operations using data strobe gating.

Description of Related Art

Semiconductor devices (e.g., memory devices) utilize timing with phase shifts of data signals, data strobes, and/or other signals to perform operations. Write operations may include postambles. The write postamble is an amount of time from when a last write bit is captured by a last falling edge of a data strobe (DQS) signal until an indeterminate/invalid state. Some specifications for the postamble may be small, introducing timing difficulties for memory devices to meet such specifications. If the internal timing exceeds the specified window, data and/or phase generation circuitry may be corrupted.

Embodiments of the present disclosure may be directed to one or more of the problems set forth above.

BRIEF DESCRIPTION OF DRAWINGS

FIG. 7 is a schematic diagram of a first latching circuitry of the latching circuitries of FIG. 3, in accordance with an embodiment;

FIG. 8 is a schematic diagram of a second latching circuitry of the latching circuitries of FIG. 3, in accordance with an embodiment.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, a write postamble is an amount of time from when a last write is bit captured by a last falling edge of a data strobe (DQS) signal until the DQS signal is returned to an indeterminate or invalid tri-state. A double data rate type five synchronous dynamic access memory (DDR5 SDRAM) device may include a specification of DDR5 that includes at least one write postamble requirement that is short (e.g., 0.5 tCK). This window may be difficult to meet due to the difficulty in shutting off an internal DQS signal in the specified short window. After this short window, an external DQS signal used to generate the internal DQS may be allowed to transition to the indeterminate or invalid tri-state. If the internal DQS signal is not shut off in this short window, then the tri-state of the external DQS signal may inadvertently cause asserted edges in the internal DQS signal after the short window. This improper assertion on the internal DQS signal may cause corruption of internal data and/or corruption of DQS phase generator circuits. Write leveling training logic may include timing skew compensation logic that may identify and compensate for internal and external timing skew to resolve indeterminacy between the DQS and a clock for the DDR5 SDRAM device. As discussed herein, the write leveling training logic may also be used to reduce postamble size to meet the short postamble specification. Since write leveling training occurs relatively close to DQS being received, using write leveling signals may include relatively few delays and may enable gating early in a DQS path to enable reduced postamble lengths as discussed herein.

Figure 1:
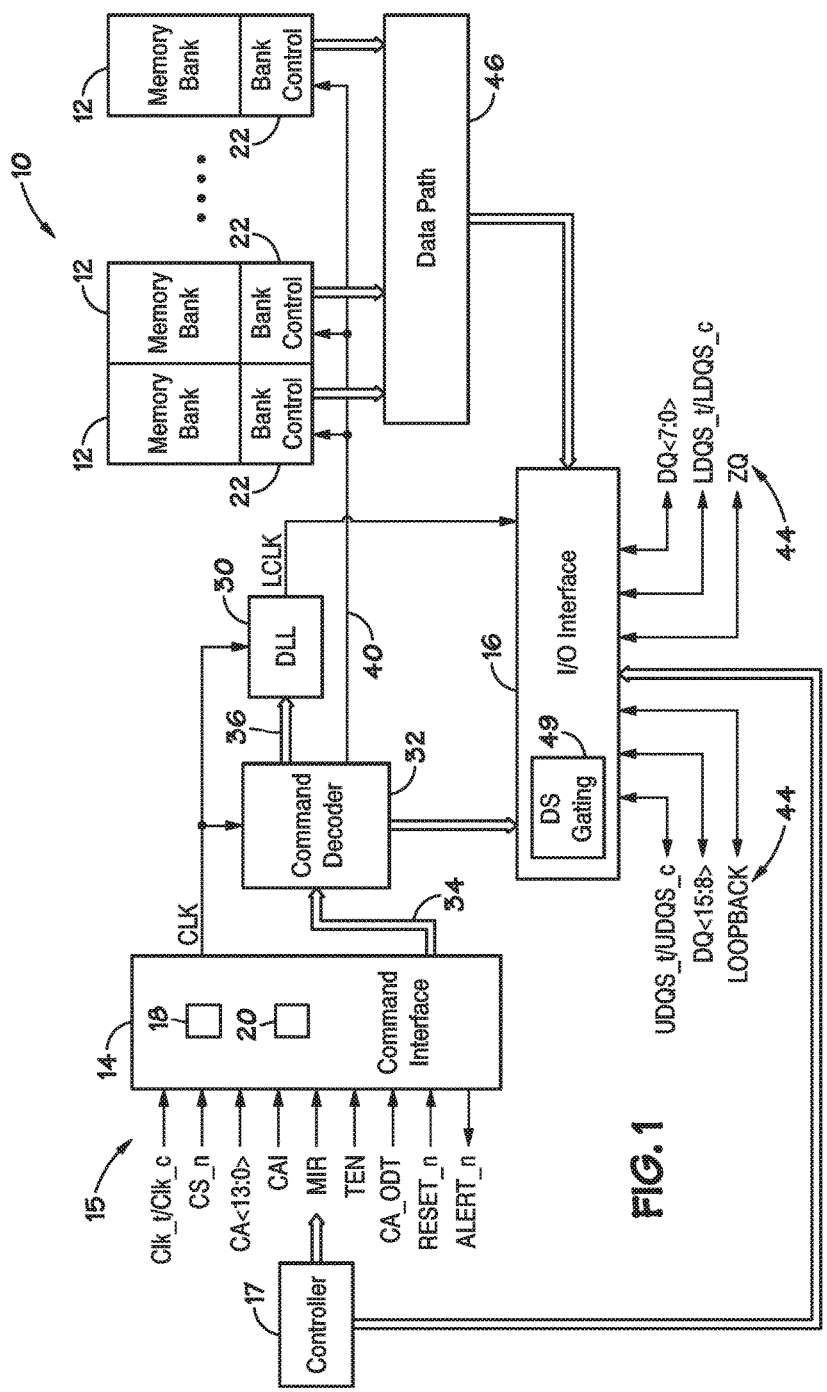
FIG. 1 is a simplified block diagram illustrating certain features of a memory device having DQS gating circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor or controller 17. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the JO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. When the DQS signal is no longer driven by the controller 17, the external DQS signal from the controller 17 to the memory device 10 will be at an unknown/indeterminate state. This state can cause undesirable behavior inside the memory device 10 because an internal DQS signal inside the memory device 10 may be at an intermediate level and/or may oscillate. In some embodiments, even the external DQS signal may ring when the controller 17 stops driving the external DQS signal.

As discussed below, the memory device 10 may attempt to disable the write circuitry after the end of the write operation as quickly as possible, to avoid false write data from being latched and overwriting previous real data. As discussed below in relation to FIGS. 2A and 2B, the DDR5 specification may include a short postamble period where the external DQS signal is still driven by the controller 17 after the last write data bit to allow time for disabling of write circuitry to propagate before the controller 17 ceases to drive the external DQS signal. The DDR5 specification may define a short (e.g., 0.5 tCK) postamble period and a long (e.g., 1.5 tCK) postamble period that may be selected using a mode register. However, the short postamble period may provide a period of time that is too short to disable write circuitry prior to the controller 17 ceasing to drive external DQS signal. As discussed below in relation to FIG. 3 and the following figures, DQS gating circuitry 49 early in the DQS pathing may disable write circuitry (e.g., the DQS signal) early enough in the DQS pathing that the disabling of the DQS signal is completed before the controller 17 stops driving the external DQS signal, in accordance with embodiments described herein.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2A:
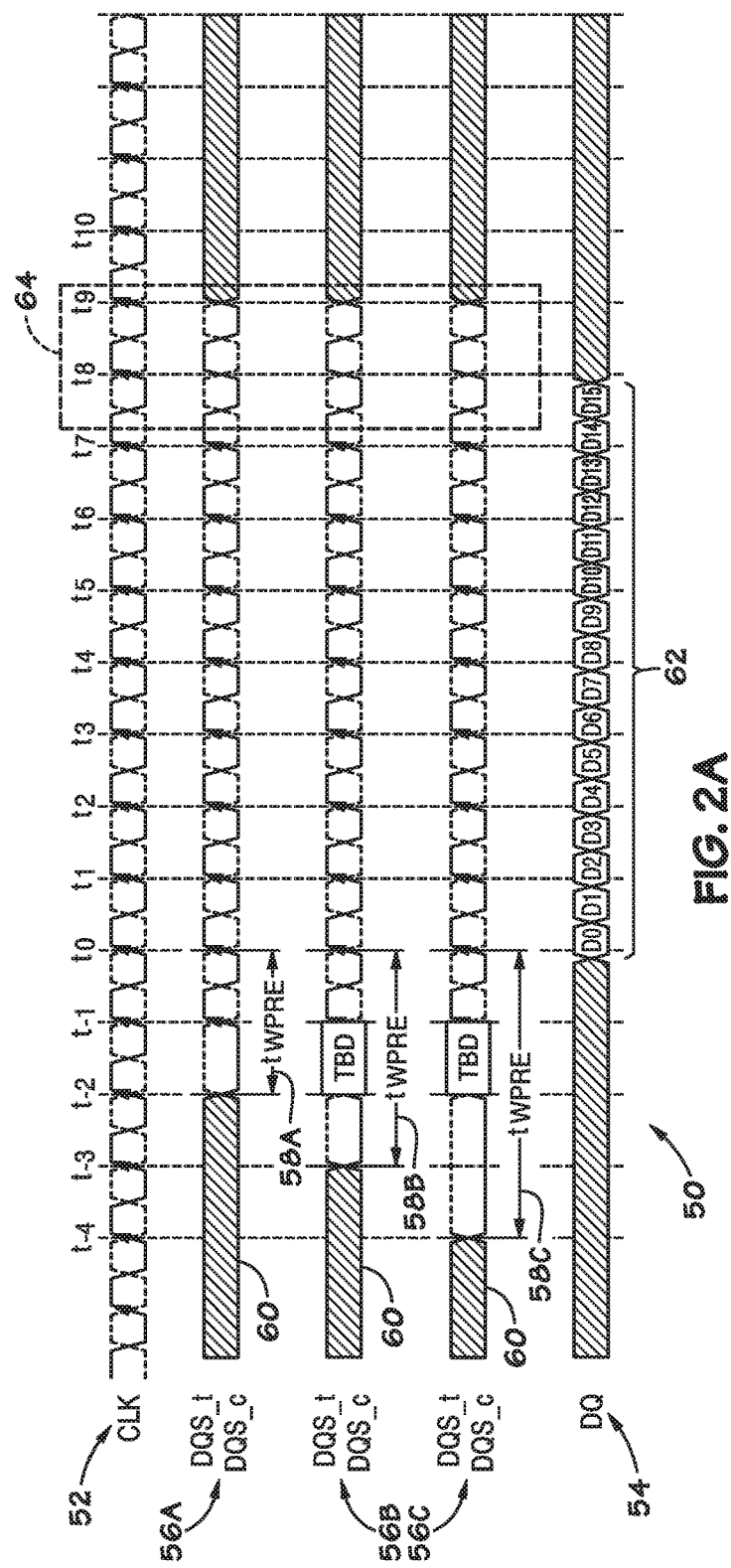
FIG. 2A is a timing diagram including a clock for the memory device of FIG. 1 using a long postamble, in accordance with an embodiment.
Figure 2B:
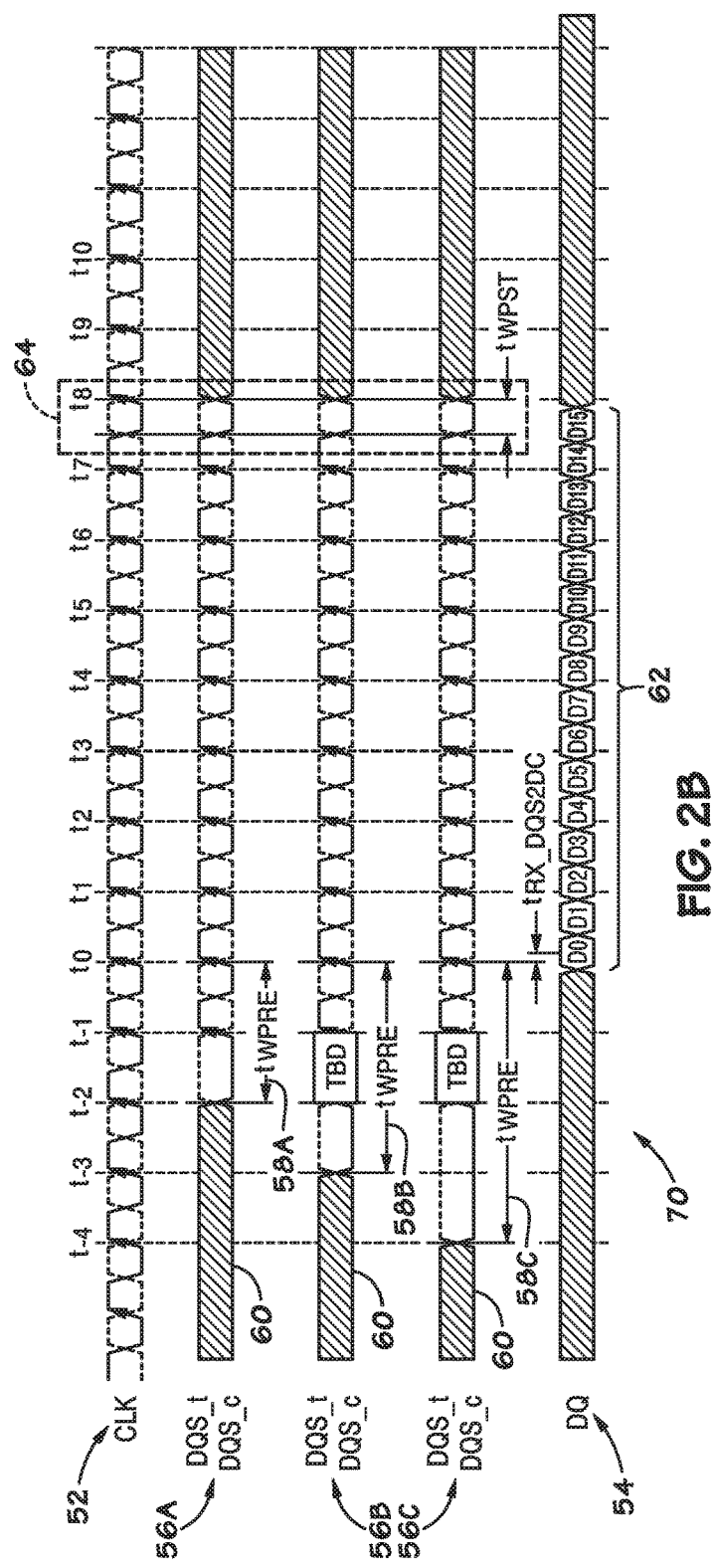
FIG. 2B is a timing diagram including a clock for the memory device of FIG. 1 using a short postamble, in accordance with an embodiment.

FIG. 2A illustrates a timing diagram 50 including a clock 52 for the memory device 10 that may be specified in the DDR5 specification. The timing diagram 50 also includes potential DQS signals 56A, 56B, and 56C that may be used to capture data transmitted in a data signal (DQ) 54. The potential DQS signal 56A includes a 2-cycle preamble 58A, the potential DQS signal 56B includes a 3-cycle preamble 58B, and the potential DQS signal 56C includes a 4-cycle preamble 58C. In some embodiments, other potential DQS signals may have other preamble lengths. Regardless of length, the preambles 58A, 58B, and 58C include a period between an indeterminate tri-state 60 and a data period 62 where data is transmitted via the data signal 54. The timing diagram 50 also shows that each of the potential DQS signals 56A, 56B, and 56C includes a write postamble 64 of 0.5 tCK where the controller 17 still drives an external DQS signal used to generate the appropriate potential DQS signal 56A, 56B, or 56C after the data period 62 before the controller 17 ceases driving the external DQS. Similarly, FIG. 2B illustrates a timing diagram 70 that is similar to the timing diagram 50 of FIG. 2A. However, as illustrated in the timing diagram 70, the write postamble may be a short preamble of 0.5 tCK.

In some embodiments, DQS gating may be used to gate the internal DQS path immediately after an input buffer in the internal DQS path after a write operation. This early gating may prevent spurious DQS edges and/or the indeterminate state of the external DQS signal from propagating to any circuitry anywhere else in the memory device 10. However, it may be difficult to cause a disable signal to functionally respond fast enough to stop the DQS signal so early in the internal DQS path. Accordingly, some embodiments may utilize write leveling training to enable the DQS path and may include a local write burst counter to count DQS pulses and use the count to disable the DQS path using the DQS gating. In some embodiments, starting the counting may begin in response to write leveling training signals to cause the count to be as closely timed as possible to this early DQS point of the DQS gating. Furthermore, in some embodiments, due to a loading fanout on DQS to drive the local write burst counter, a walkback technique may also be employed to increase responsiveness of the synchronized disable of the DQS path by using a slower clock at different stages of the DQS gating circuitry 49, as discussed below. Specifically, counters counting early tCKs during the write operation may use a slow clock, and other counters counting later tCKs progressively use faster clocks to include less gate delays to gate an end of the write operation. This walkback technique provides fast timing for later tCKs of a writing operation but enables placement of inverters to amplify the DQS path to compensate for fanout loading on the DQS.

Figure 3:
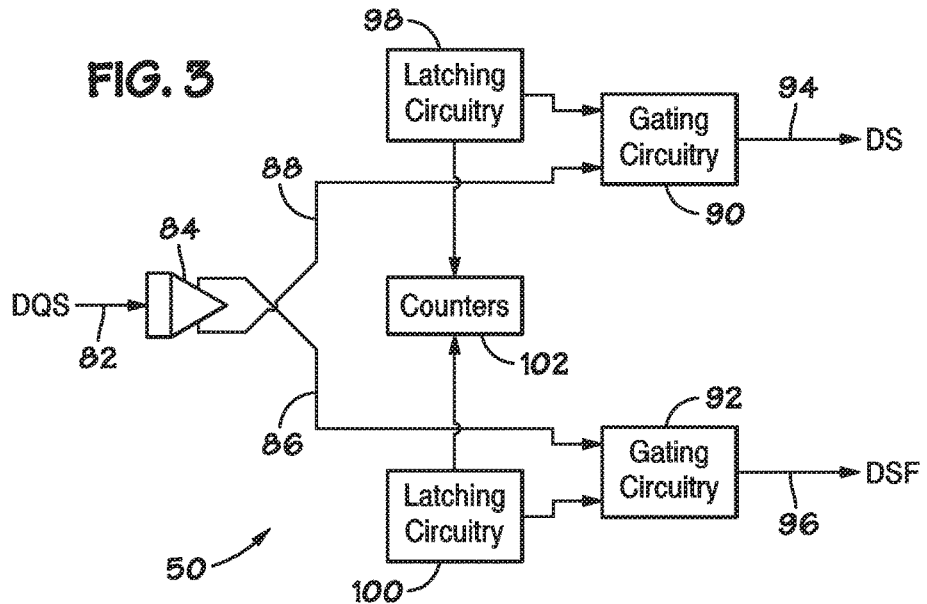
FIG. 3 is a schematic diagram of the DQS gating circuitry of FIG. 1 that may be used to implement the timing diagrams of FIGS. 2A and 2B using latching circuitries, in accordance with an embodiment.

FIG. 3 is a schematic diagram of an embodiment of the DQS gating circuitry 49. In the illustrated embodiment, the DQS gating circuitry 49 receives a DQS signal 82. The DQS signal 82 may be an external DQS signal received from the controller 17 or an internal DQS signal that is generated from the external DQS signal using an amplifier. The DQS signal 82 is passed to an input buffer 84 that receives and passes the DQS signal 82 as a DS signal 86. Since this portion of the memory device 10 with the DS signal 86 uses single-direction communication rather than bi-direction capable through a bi-directional bus, the "Q" is omitted from the name of the DQS signal 82 in the name of the DS signal 86. The input buffer 84 also generates a logical complement of the DS signal 86 as a DSF signal 88. The input buffer 84 may isolate circuitry passing and/or generating the DQS signal 82 from the rest of the DQS gating circuitry 49. The DQS gating circuitry 49 also includes gating circuitry 90 that receives the DSF signal 88 to create a gated DS signal 94 that is a gated version of the DQS signal 82. The gating circuitry 90 occurring directly after the input buffer 84 enables fast disabling of the DQS signal 82 at the gated DS signal 94 as long as control signals of the gating circuitry 90 respond quickly to an end of the write operation to cease passing the DQS signal 82. The DQS gating circuitry 49 also includes gating circuitry 92 that receives the DS signal 86 to create a gated DSF signal 96 that is a gated signal that is a logical complement to the DQS signal 82. As discussed below in relation to FIG. 7, the DQS gating circuitry 49 includes latching circuitry 98 that controls the gating circuitry 90 to generate the gated DS signal 94. Furthermore, as discussed below in relation to FIG. 8, the DQS gating circuitry 49 includes latching circuitry 100 that controls the gating circuitry 92 to generate the gated DSF signal 96. The latching circuitries 98 and 100 are controlled using counters 102 and/or write leveling signals. The use of the counters 102 is discussed in relation to FIGS. 4-6 below.

Figure 4:
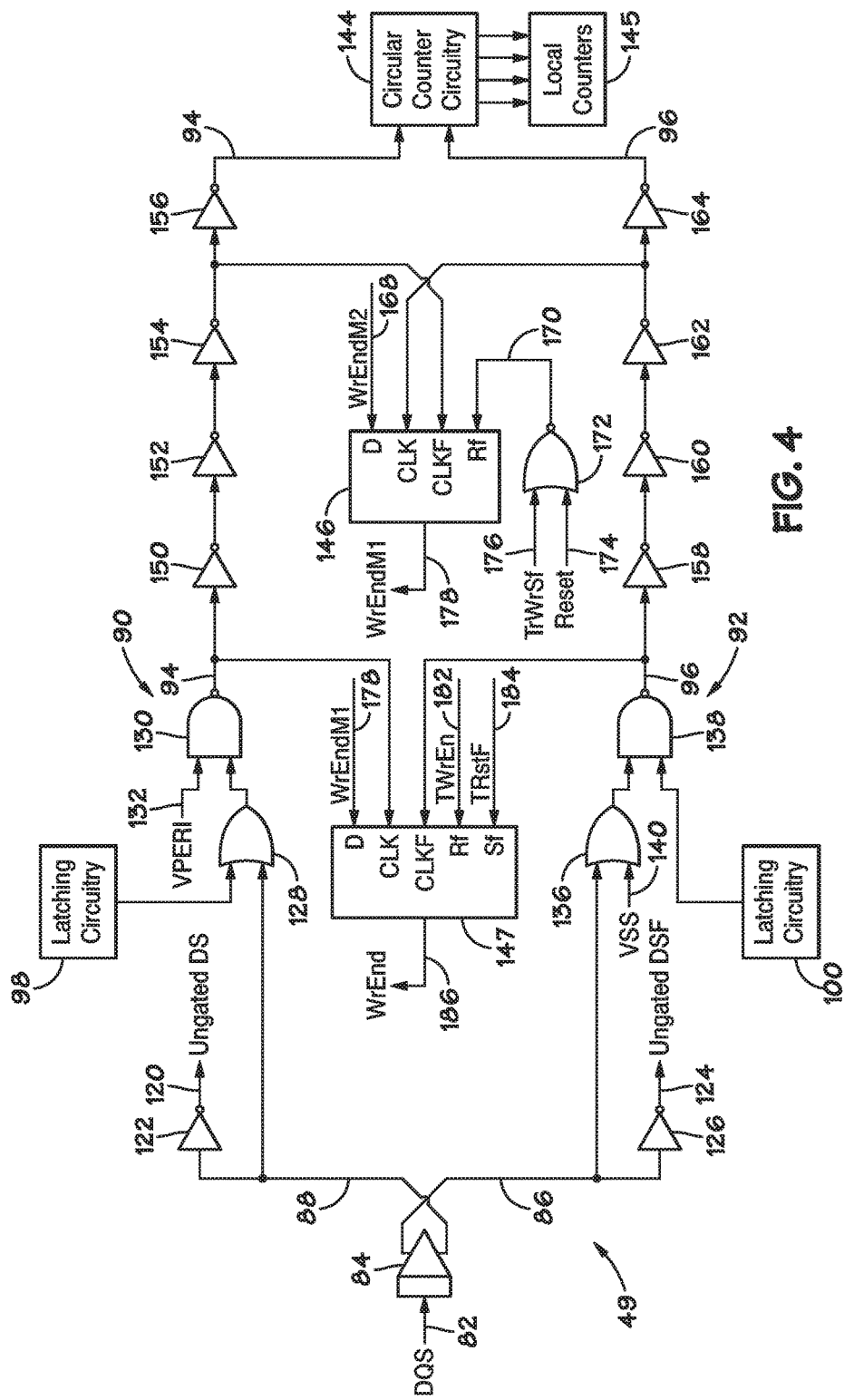
FIG. 4 is a schematic diagram of a detailed depiction of the DQS gating circuitry of FIG. 3 including circular counter circuitry and local counters, in accordance with an embodiment.

FIG. 4 illustrates a detailed embodiment of the DQS gating circuitry 49. As illustrated, the DSF signal 88 may be used to generate an ungated DS signal 120 that may be used at other points in the DQS gating circuitries 90 and 92. The ungated DS signal 120 is a pre-gated version of the gated DS signal 94. Furthermore, the ungated DS signal 120 may be generated from the DSF signal 88 using one or more inverters 122 that may be used to amplify the ungated DS signal 120 due to potential loading due to routing and distribution of the ungated DS signal 120 in the DQS gating circuitry 49.

Similar to the ungated DS signal 120, the DQS gating circuitry 49 may generate an ungated DSF signal 124 using the DS signal 86. The ungated DSF signal 124 may be used at other points in the DQS gating circuitries 90 and 92. The ungated DSF signal 124 is a pre-gated version of the gated DSF signal 96. Furthermore, the ungated DSF signal 124 may be generated from the DS signal 86 using one or more inverters 126 that may be used to amplify the ungated DSF signal 124 due to potential loading due to routing and distribution of the ungated DSF signal 124 in the DQS gating circuitry 49.

As illustrated, the gating circuitry 90 includes an OR gate 128 and a NAND gate 130. The OR gate 128 receives the DSF signal 88 and a control from the latching circuitry 98 and outputs to the NAND gate 130. The NAND gate 130 receives the output of the OR gate 128 and receives a voltage 132 to produce the gated DS signal 94. Using the control from the latching circuitry 98 and the DSF signal 88 to control the NAND gate 130 (along with the voltage 132) causes the NAND gate 130 to invert the DSF signal 88 to generate the gated DS signal 94 when the control from the latching circuitry 98 enables passing through the gating circuitry 90.

The gating circuitry 92 includes an OR gate 136 and a NAND gate 138. The OR gate 136 receives the DS signal 86 and VSS 140 and outputs to the NAND gate 138. The NAND gate 138 receives the output of the OR gate 136 and a control from the latching circuitry 100. Similar to the gating circuitry 90, using the control from the latching circuitry 100 and the DS signal 86 to control the NAND gate 138 causes the NAND gate 138 to invert the DS signal 86 to generate the gated DSF signal 96 when the control from the latching circuitry 100 enables passing through the gating circuitry 92.

As discussed below, the latching circuitries 98 and 100 include synchronized latches that control the respective gating circuitries 90 and 92 to gate the DS signal 86 and the DSF signal 88. The gated DS signal 94 and the gated DSF signal 96 are then passed to write circuitry when passing data through the gating circuitries 90 and 92 is enabled. As previously noted, the latching circuitries 98 and 100 control respective gating circuitries 90 and 92, and the counters 102 track write operations to turn off quickly after a last bit of a write. The counters 102 may include circular count circuitry 144 and local counters 145. The local counters 145 count write bits in a write to determine when the write operation has ended. The local counters 145 are discussed in relation to FIG. 5 below. The local counters 145 may include and/or be supplemented with one or more additional counters 146 and 147. As discussed below in relation to FIG. 6, the circular count circuitry 144 may be used to add circular count functions when write operations are too frequent to reset counting in the counters 102 between write operations.

To amplify the gated DS signal 94 and the gated DSF signal 96, the DQS gating circuitry 49 includes inverters 150, 152, 154, 156, 158, 160, 162, and 164, collectively referred to as inverters 150-164. As discussed below, the inverters 150-164 may create timing differences that may be used to walkback clocking of various stages separated by the inverters 150-164 and/or other inverters in the memory device 10.

As noted previously, the counters 102 may include and/or be supplemented by the counters 146 and 147. Each of the counters 146 and 147 may count respective ungated cycles of the DQS signal 82. As indicated, the counters 146 and 147 utilize the gated DS signal 94 and the ungated DSF signal 96 after receiving signals from the local counters 145 to determine whether the counters 146 or 147 should count a bit. As illustrated, each of the counters 146 and 147 each includes a flip flop that uses the gated DS signal 94 and the ungated DSF signal 96, both received from the circular count circuitry 144, to gate data on its data pin. The data pin indicates whether a previous bit has been counted. When the data pin transitions high, the asserted data pin activates the corresponding flip flop to output the asserted value when a transition occurs on the gated DS signal 94 and the ungated DSF signal 96. Thus, the counters 102 (including the counters 146 and 147) may include one or more flip flop counters that count clock cycles of a write operation. For instance, for a 16-bit pre-fetch of a DDR write, eight counters may be included in the counters 102 to determine when eight clock cycles have elapsed as an indicator that that 16-bits (one on each rising and falling edge of a cycle) have been passed.

The counter 146 receives a WrEndM2 168 from the local counters 145 as an indicator that the local counters 145 have counted all corresponding bits, and the counter 146 is now to be used as the appropriate counter in the DQS gating circuitry 49. The counter 146 may be reset using a signal 170 that is generated using a NOR gate 172 that receives a reset signal 174 and a TrWrSt signal 176. The TrWrSt signal 176 indicates whether a trained write leveling has started. The reset signal 174 indicates that the counters 102 are to be reset. When write leveling training has started (e.g., TrWrSt signal 176 is logically high) and the reset signal 174 is logically high, the counter 146 is reset. When the WrEndM2 168 is logically high, a pulse on the gated DS signal 94 causes a WrEndM1 178 to be output as a logical high.

The counter 147 receives the WrEndM1 178 as an input. A reset pin of the counter 147 may receive a signal TWrEn 182 indicative that write leveling training has been enabled. A set pin of the counter 147 may receive a signal TRstF 184 indicating that write leveling training is to be reset as a new write operation is to occur. The counter 147 outputs a WrEnd 186 signal that transitions high when a last bit (e.g., eighth cycle of operation) corresponding to the counter 147 has passed. In other words, the WrEnd 186 indicates that the write operation is completing. As discussed below, the WrEnd 186 may be used to control the latching circuitries 98 and 100.

Figure 5:
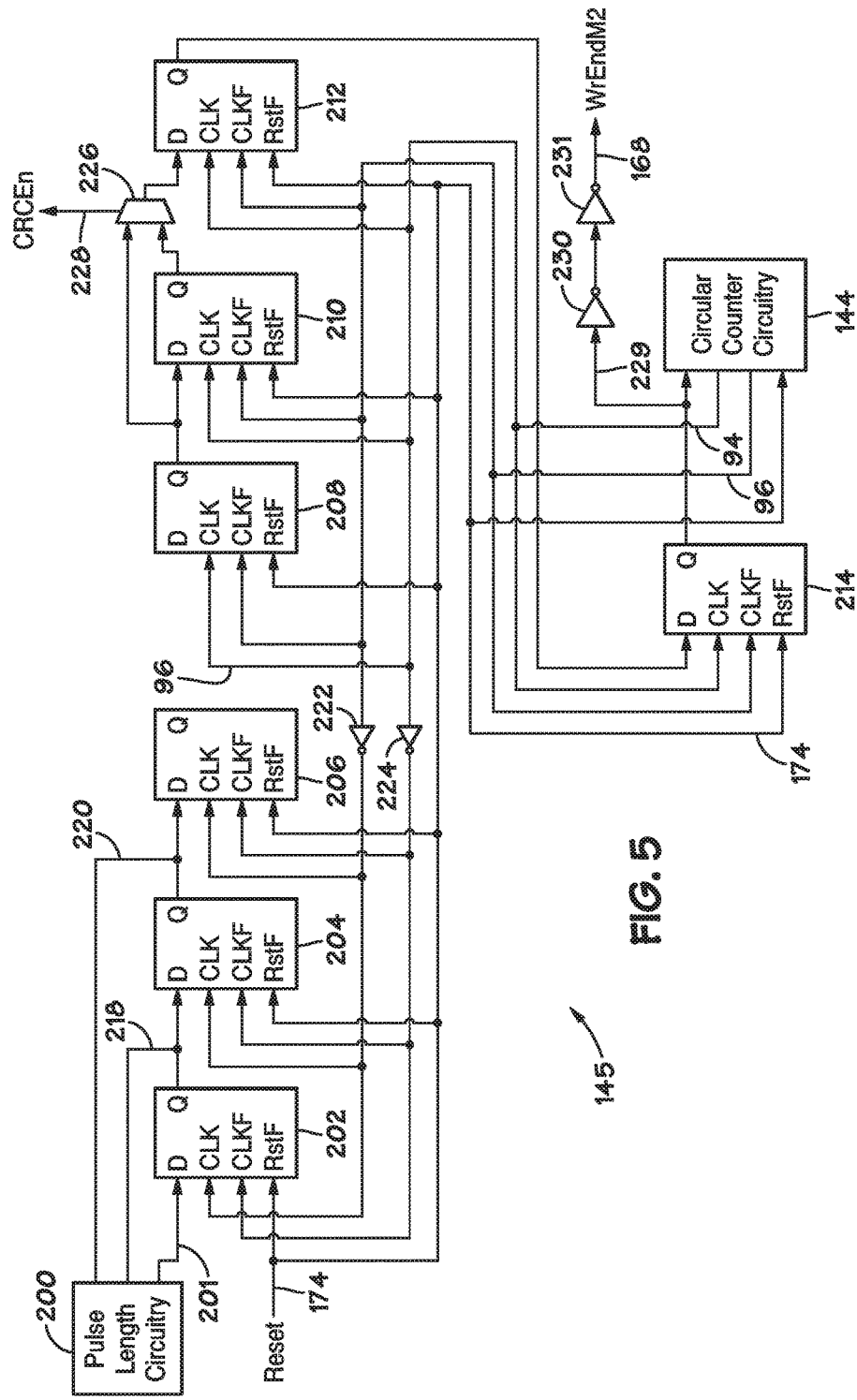
FIG. 5 is a schematic diagram of the local counter of FIG. 4 including pulse length circuitry, in accordance with an embodiment.

As previously noted, FIG. 5 is a schematic diagram of the local counters 145. The local counters 145 include pulse length circuitry 200 that ensures that the data being passed through the local counters 145 has a set length (e.g., 2 tCKs). In some embodiments, the pulse length circuitry 200 may receive a signal from the circular count circuitry 144 to control whether counting data 201 is passed to counters 202, 204, 206, 208, 210, 212, and/or 214 (e.g., flip flops). To ensure the proper length, the pulse length circuitry 200 may receive Q1 signal 218 from an output of the counter 202 and a Q2 signal 220 from an output of the counter 204. The counters 202, 204, 206, 208, 210, 212, and 214 may be reset using the reset signal 174 and may be gated using gated DS signal 94 and gated DSF signal 96. Each of the counters 202, 204, 206, 208, 212, and 214 correspond to a specific cycle in a write operation. Accordingly, the number of counters included in the local counters 145 may be dependent on a length of a write operation. To create stages of different clock speeds in the DQS gating circuitry 49 for walkback, inverters 222 and 224 may be inserted on the gated DS signal 94 and gated DSF signal 96.

The memory device 10 may selectively utilize a cyclic redundancy check (CRC). Use of the CRC adds an additional bit to the write operation. To address this potential additional bit, a counter 210 may be used when CRC is enabled and bypassed when CRC is not enabled. For example, a multiplexer 226 may be used to selectively bypass the counter 210 using a CRC enable 228, where enabling the CRC selects the output of the counter 210, and disabling the CRC selects the output of the counter 208.

When all of the counters of the local counters 145 have counted, the local counters 145 output a signal 229 that is the WrEndM2 168 passed to the counter 146, as previously discussed, and/or additional locations. In some embodiments, one or more inverters 230 and 231 may be included to amplify WrEndM2 168 for routing in the memory device 10.

Figure 6:
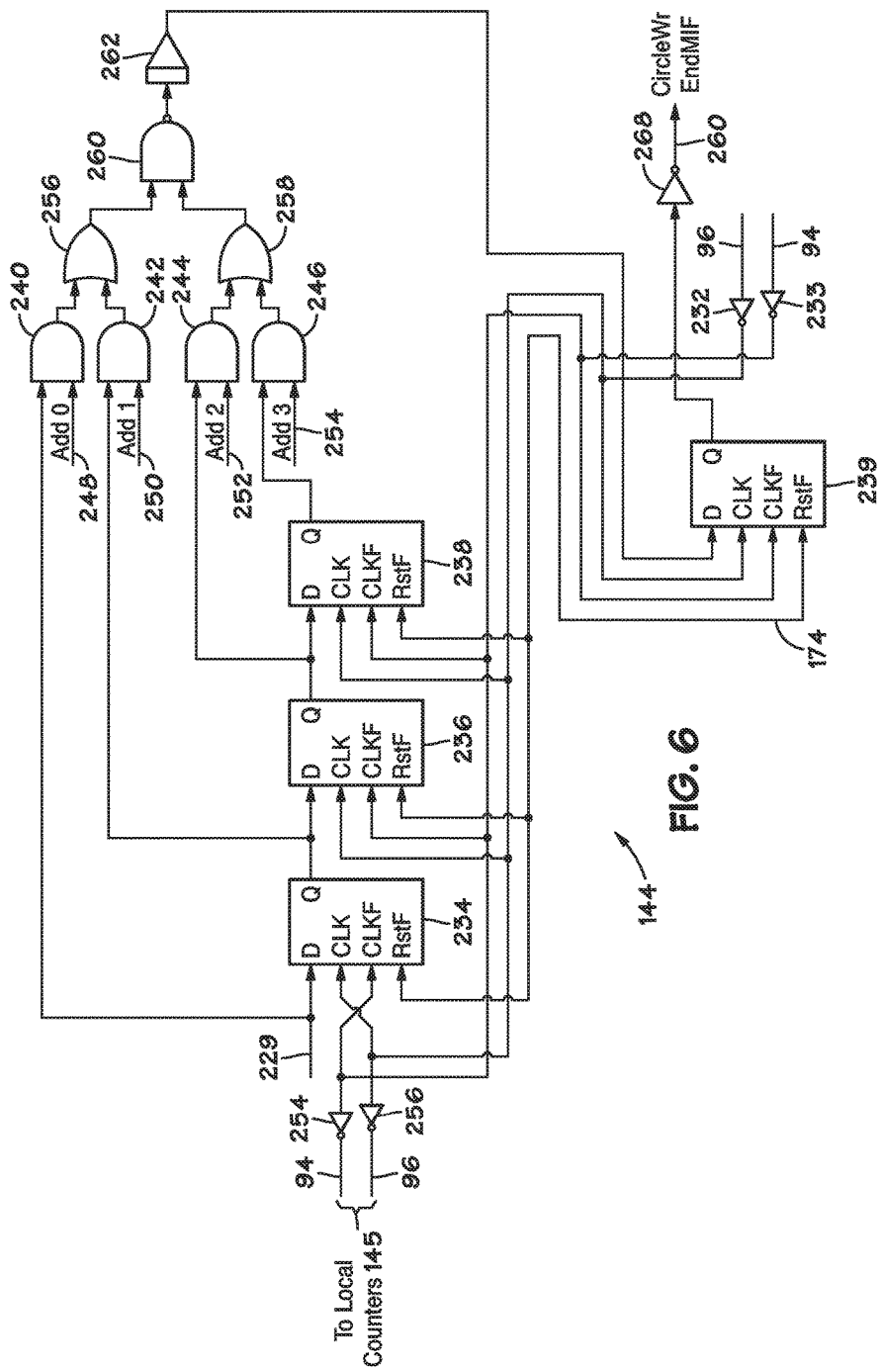
FIG. 6 is a schematic diagram of the circular count circuitry of FIG. 4, in accordance with an embodiment.

FIG. 6 is a schematic diagram of the circular count circuitry 144. The circular count circuitry 144 receives the gated DSF signal 96 and the gated DS signal 94 at inverters 232 and 233, respectively. The circular count circuitry 144 includes flip flops 234, 236, 238, and 239 that are gated using the gated DS signal 94 and the gated DSF signal 96. The flip flop 234 receives the signal 229 from the counter 214. The circular count circuitry 144 includes AND gates 240, 242, 244, and 246 that may be used to add additional cycles by including additional counters (e.g., counters 234, 236, and 238) in the path using signals 248, 250, 252, and 254, OR gates 256 and 258, and NAND gate 260. In some embodiments, other multiplexer-like circuitry may be used to implement the selection function using the AND gates 240, 242, 244, and 246, the OR gates 256 and 258, and the NAND gate 260.

Other delays, such as delay 262, may be used to delay the path further. The selected delays (e.g. 0, 1, 2, 3) may be passed to the counter 239 to generate a CircleWrEndM1F 266. The counter 239 may be an equivalent stage for the counter 146. As discussed below, a counter equivalent to the counter 147 may be included in the pulse length circuitry 200. In some embodiments, the CircleWrEndM1F 266 may be generated by passing through one or more inverters 268. As discussed below, the CircleWrEndM1F 266 may be passed to the pulse length circuitry 200 to restart another count through the local counters 145 when a reset of the local counters 145 has not occurred due to small spacing between write operations.

FIG. 7 is a schematic diagram of the latching circuitry 98. The latching circuitry 98 receives the WrEnd 186 from the counter 147. The latching circuitry 98 inverts the WrEnd 186 via an inverter 282. The latching circuitry 98 then passes the inverted WrEnd 186 to a NOR gate 284 along with a received WrStart 286 that indicates that a write operation is starting.

The WrEnd 186 from the counter 147 fires at a last rising edge of the gated DS signal 94. The WrEnd 186 places a latch 288 in a ready state on the last rising edge (i.e., next-to-last bit of write operation). The last bit (i.e., last falling edge) is detected via the ungated DSF signal 124. The last bit triggers the latch 288 with minimal delays due to gates to disable passage of the DQS signal 82 to write circuitry quickly after the write operation has completed. In other words, when the WrStart 286 is simultaneously high with the ungated DSF signal 124, the latch 288 is reset to output a DSEnF signal 290 as low enable pass-through of the gating circuitry 90 as the gated DS signal 94. When the WrEnd 186 signal transitions high while the WrStart 286 is low and the ungated DSF signal 124 is high, the latch 288 is set and the DSEnF signal 290 transitions high to disable the pass-through of the gating circuitry 90.

FIG. 8 is a schematic diagram of the latching circuitry 100 that works similarly to the latching circuitry 98 discussed in relation to FIG. 7 above. The latching circuitry 100 receives the WrEnd 186 from the counter 147. The latching circuitry 100 receives and inverts the WrEnd 286 via an inverter 300 to generate inverted WrStart 301. The latching circuitry 100 then passes the inverted WrStart 301 to a NAND gate 302 along with the WrEnd 186. The latching circuitry 100 includes a latch 304 that controls the gating circuitry 92 using a DSEn signal 306 after/during the last cycle of the ungated DS signal 120 of the write operation.

Figure 9:
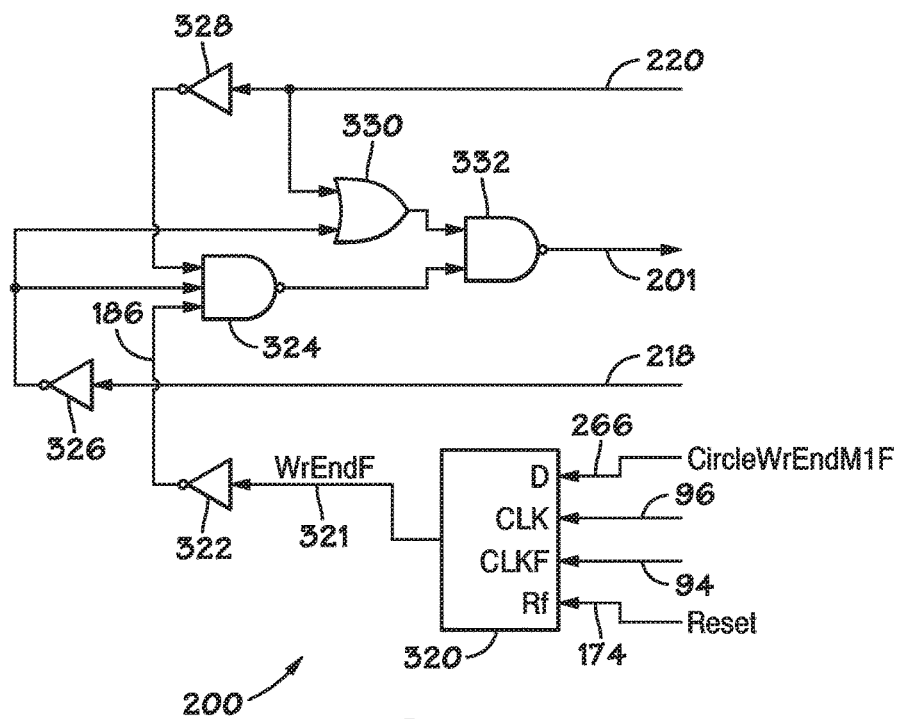
FIG. 9 is a schematic diagram of the pulse length circuitry of FIG. 5, in accordance with an embodiment.

FIG. 9 is a schematic diagram of the pulse length circuitry 200 of the local counters 145. The pulse length circuitry 200 includes a counter 320, such as a flip flop, that receives the CircleWrEndM1F 266 from the counter 239 in the circular count circuitry 144 of FIG. 6. The counter 239 completes the circular count function of the circular count circuitry 144 by acting as an equivalent stage for the counter 147. Thus, the circular count function indicates that a write function is ending using a WrEndF 321 signal that may be inverted using an inverter 322 to generate the WrEnd 186 that may be passed to the latching circuitries 98 and 100 as an indicator that the last cycle (e.g., rising edge) of the write operation has started to enable the latching circuitries 98 and 100 to gate the DQS signal 82 at the end (e.g., falling edge) of the last cycle.

The pulse length circuitry 200, as previously discussed, receives the Q1 signal 218 from the counter 202 of the local counters 145 in FIG. 5. The pulse length circuitry 200 inverts the Q1 signal 218 using an inverter 322 and passes the inverted Q1 signal 218 to a NAND gate 324. Also, as previously discussed, the pulse length circuitry 200 receives the Q2 signal 220 from the counter 204 of the local counters 145 in FIG. 5. The pulse length circuitry 200 inverts the Q2 signal 220 using an inverter 328 and passes the inverted Q2 signal 220 to the NAND gate 324. The WrEnd 186 is also passed to the NAND gate 324. The Q1 signal 218 and the Q2 signal 220 are passed to an OR gate 330 in addition to being passed to the NAND gate 324. The output of the OR gate 330 is passed to a NAND gate 332 that also receives the output of the NAND gate 324. The output of the NAND gate 332 is the counting data 201 that is a pulse having a set length (e.g., 2 tCKs). Table 1 below shows a truth table reflecting the values of the counting data 201 relative to the Q1 signal 218, the Q2 signal 220, and the WrEnd 186.

TABLE 1

Truth table reflecting pulse passed through local counters

| WrEnd 186 | Q1 signal 218 | Q2 signal 220 | Counting data 201 |
|---|---|---|---|
| 0 | 0 | 0 | 0 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 1 |
| 1 | 1 | 1 | 0 |

As illustrated in Table 1, the pulse length circuitry 200 ensures that the counting data 201 only passes a pulse that is two tCKs wide even when the CircleWrEndM1F 266 is wider than or narrower than two tCKs due to distortion due to stage clocking and routing of the DQS gating circuitry 49. In other words, when the CircleWrEndM1F 266 and/or the resulting WrEnd 186 is wider than 2 tCKs, the pulse length circuitry 200 cuts the CircleWrEndM1F 266 short. Similarly, when the CircleWrEndM1F 266 and/or the resulting WrEnd 186 is narrower than 2 tCKs, the pulse length circuitry 200 extends the width to ensure that the counting data 201 has a pulse width of 2 tCKs.

Using all the subcomponents, the DQS gating circuitry 49 enables disabling of the DQS signal 82 to write circuitry by utilizing 1) write leveling training and 2) progressive clocking. The use of write leveling training enables gating of the DQS signal 82 early in an internal DQS path thereby enabling the counters 102 to be used to start and end at the same point in the internal DQS path. The progressive clocks are used for multiple shift register stages that utilize clocking that progressively increases in speed until the fastest clock (e.g., ungated DS signal 120 and ungated DSF signal 124). This technique may be referred to as a walkback technique. Although all clocked devices may use a one single fastest clock signal (e.g., ungated DS signal 120 and ungated DSF signal 124), loading may be much too large for such timing to be possible. The walkback technique is instead used to put the early stages of the local counters 145 on a clock that is a heavily buffered (and therefore delayed) version of clock and progressively use faster clocks up to the end (e.g., ungated DS signal 120 and ungated DSF signal 124 in the latching circuitries 98 and 100). As illustrated, the walkback technique occurs over 8 stages. Counters 202, 204, and 206 are at a heavily buffered, slowest clock. The counters 208, 210, and 212 are one inverter faster. Specifically, timing for the counters 208, 210, and 212 using the gated DS signal 94 and the gated DSF signal 96 do not pass through the inverters 222 and 224 as it does for the counters 202, 204, and 206. Similarly, the counter 146 is three inverters (inverters 254/256, inverters 232/233, and inverters 156/164) faster than the counters 208, 210, and 212. As previously discussed, the counter 239 is equivalent to the counter 146 in timing. The counter 147 is three inverters (inverters 154/162, inverters 152/160, and inverters 150/158) faster than the counter 146. The fastest clock at the counter 147 is approximately the same speed as the ungated DS signal 120 and the ungated DSF signal 124 since both are clocked by one gate after the DQS input buffer 84.

As appreciated, synchronous elements are on the gated version of the clock (gated DS signal 94 and gated DSF signal 96) to prevent counting spurious and/or indeterminate states of the DQS signal 82 when it is undriven by the controller 17 after the postamble period. The latching circuitries 98 and 100 are the exception that use the ungated DS signal 120 or the ungated DSF signal 124, because the latching circuitries 98 and 100 are placed in active states by a write end generated from the end of the write operation on the gated DS signal 94/gated DSF signal 96. The latching circuitries 98 and 100 use the ungated DS signal 120 or gated DSF signal 124 to control output states only in the active states set by the WrEnd 186 generated using the gated DS signal 94/gated DSF signal 96. Thus, the latching circuitries 98 and 100 are constructed to be able to hold respective latched states even after the DQS signal 82 goes indeterminate. Furthermore, by using a simple "AND" functionality with the WrEnd 186 to cut off the ungated DSF signal 124 and ungated DS signal 120 inputs, the latching circuitries 98 and 100 cut off DQS enable signals (e.g., DSEn signal 306) similar to cutting off the DQS signal 82 through the gating circuitries 90 and 92.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
an input data strobe (DQS) buffer configured to receive a DQS signal;
gating circuitry configured to toggle a connection of the DQS signal to write circuitry using a gated signal that reflects the DQS signal when the connection is enabled; and
one or more counters configured to count cycles of the gated signal during a write operation when the connection is enabled, wherein the gating circuitry is configured to toggle the connection based at least in part on the counted cycles of the gated signal, wherein the gated signal comprises a cyclic redundancy check (CRC) when enabled in a mode register for the memory device.

2. The memory device of claim 1, wherein the one or more counters are each configured to count each bit of the write operation.

3. The memory device of claim 2, wherein each of the one or more counters comprises a flip flop that counts pulses on a gated version of the DQS signal by receiving the gated version of the DQS signal output from the gating circuitry, wherein the gated version of the DQS signal output is received at a clock pin of the flip flop and a counting data pulse is passed sequentially through the counters using the gated version of the DQS signal.

4. The memory device of claim 3, wherein the gated version comprises a gated data signal (DS) that is logically equivalent to the DQS signal or a gated data signal false (DSF) that is a logical complement to the DS.

5. The memory device of claim 1, wherein the gated signal comprises 16 bits of double-data rate (DDR) on 8 consecutive cycles of the DQS signal.

6. The memory device of claim 1, comprising circular count circuitry that add additional cycles to the cycles when two consecutive write operations occur to quickly to reset the one or more counters.

7. The memory device of claim 1, comprising latching circuitry that generates a gating enable signal based at least in part on the counted cycles of the write operation, wherein the gating enable signal controls operation of the gating circuitry.

8. The memory device of claim 7, wherein the latching circuitry is configured to receive a write end (WrEnd) signal indicative of a beginning of a last cycle of the write operation to place the latching circuitry in an active mode where a next falling edge of the gated signal is configured to change the gating enable signal.

9. The memory device of claim 8, wherein the WrEnd signal is received from a last-cycle counter of the one or more counters that is configured to count a last cycle of the write operation.

10. The memory device of claim 1, wherein the gating circuitry is connected directly to input buffer with no logic gates therebetween.

11. A method, comprising:
receiving a DQS signal at a memory device from a controller;
gating the DQS signal with gating circuitry to produce a gated DS signal during a write operation;
counting cycles of the gated DS signal using one or more counters; and
when the counted cycles indicate that the write operation is completed, toggling the gating circuitry to cease passing the DQS signal as the gated DS signal to write circuitry, wherein toggling the gating circuitry occurs after a write operation but before the received DQS signal transitions to an indeterminate state due to the controller ceasing to drive the received DQS signal.

12. The method of claim 11, wherein counting the cycles of the gated DS signal comprises toggling a counter of the one or more counters for each cycle of the gated DS signal during the write operation.

13. The method of claim 12, wherein counting the cycles of the gated DS signal comprises passing the gated DS signal to a flip flop of each counter and passing a counting data pulse through the counters by connecting a data pin of the flip flop to an output pin of a previous bit counter of the one or more counters to propagate the counting data pulse through the one or more counters using the gated DS signal.

14. The method of claim 11, wherein toggling the gating circuitry comprises:
receiving a write end (WrEnd) signal that indicates that a last cycle of the write operation has started;
in response to the WrEnd signal, placing latching circuitry in an active state;
receiving an ungated version of the DQS signal; and
when the ungated version of the DQS signal transitions high while the WrEnd signal is in the active state, disabling output of the DQS signal as the gated DS signal.

15. A memory device, comprising:
an input data strobe (DQS) buffer configured to receive a DQS signal and output a data signal (DS) and a data false signal (DSF);
first gating circuitry configured to toggle a first connection of the DS to write circuitry using a gated DS signal that reflects the DS signal when the first connection is enabled;
second gating circuitry configured to toggle a second connection of the DSF to write circuitry using a gated DSF that reflects the DSF when the second connection is enabled;
one or more counters configured to count cycles of the gated DS and the gated DSF when the first and second connections are enabled by passing a counting data pulse sequentially through the one or more counters;
first latching circuitry configured to control the first gating circuitry based at least in part on the counted cycles; and
second latching circuitry configured to control the second gating circuitry based at least in part on the counted cycles.

16. The memory device of claim 15, wherein the one or more counters comprises pulse length circuitry configured to cause the counting data pulse to have an expected length from a write end (WrEnd).

17. The memory device of claim 16, wherein the one or more counters comprises circular count circuitry configured to add circular count functionality when consecutive write operations are too frequent to reset the one or more counters between the consecutive write operations.

18. The memory device of claim 15, wherein the one or more counters are configured to walkback a plurality of progressive clocks in the one or more counters having a plurality of shift register stages that each utilizes a different progressive clock of the plurality of progressive clocks to progressively increase speed for each corresponding shift register stage until a fastest clock of the plurality of progressive clocks is used on a final register stage of the plurality of shift register stages.

\* \* \* \* \*